(12) United States Patent
Lin et al.

(10) Patent No.: US 11,898,238 B2
(45) Date of Patent: *Feb. 13, 2024

(54) SHIELDING DEVICE AND THIN-FILM-DEPOSITION EQUIPMENT WITH THE SAME

(71) Applicant: SKY TECH INC., Hsinchu County (TW)

(72) Inventors: Jing-Cheng Lin, Hsinchu County (TW); Yu-Te Shen, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 323 days.

This patent is subject to a terminal disclaimer.

(21) Appl. No.: 17/494,017

(22) Filed: Oct. 5, 2021

(65) Prior Publication Data
US 2022/0411917 A1    Dec. 29, 2022

(30) Foreign Application Priority Data

Jun. 29, 2021   (TW) .................................. 100123821

(51) Int. Cl.
*H01J 37/34* (2006.01)
*C23C 14/56* (2006.01)
*C23C 14/02* (2006.01)

(52) U.S. Cl.
CPC .......... *C23C 14/564* (2013.01); *C23C 14/021* (2013.01); *H01J 37/3441* (2013.01); *H01J 37/3447* (2013.01)

(58) Field of Classification Search
CPC ..... C23C 14/564; C23C 14/021; C23C 14/50; H01J 37/3447; H01J 37/3441; H01L 21/67103; H01L 21/67213

(Continued)

(56) References Cited

U.S. PATENT DOCUMENTS 11,476,101 B1 * 10/2022 Lin .................... H01L 21/67028
11,527,391 B1 * 12/2022 Lin .................... H01J 37/32651
11,532,469 B1 * 12/2022 Lin .......................... C23C 14/34

FOREIGN PATENT DOCUMENTS

| JP | 2018-095927 | * | 6/2018 |
| WO | WO 2013136576 A1 | * | 9/2013 |
| WO | WO 2015019730 A1 | * | 6/2014 |

OTHER PUBLICATIONS

Abstract JP 2018-095927 (Year: 2018).*

* cited by examiner

*Primary Examiner* — Rodney G McDonald
(74) *Attorney, Agent, or Firm* — Chun-Ming Shih; HDLS IPR SERVICES

(57) ABSTRACT

The present disclosure provides a thin-film-deposition equipment with shielding device, which includes a reaction chamber, a carrier and a shielding device. The shielding device includes a first-shield member, a second-shield member and a driver. The first-shield member has a first-inner-edge surface disposed with a protrusion. The second-shield member has a second-inner-edge surface disposed with a cavity. The driver interconnects and drives the first-shield member and the second-shield member to sway in opposite directions. During a cleaning process, the driver swings the shield members toward each other into a shielding state for covering the carrier, such that to prevent polluting the carrier during the process of cleaning the thin-film-deposition equipment.

20 Claims, 12 Drawing Sheets

(58) Field of Classification Search
USPC .................................................. 204/298.11
See application file for complete search history.

SHIELDING DEVICE AND THIN-FILM-DEPOSITION EQUIPMENT WITH THE SAME

TECHNICAL FIELD

The present disclosure relates to a shielding device and a thin-film-deposition equipment with the same, which mainly employ shield members to cover a substrate carrier, in order to prevent polluting the carrier during a process of cleaning the reaction chamber.

BACKGROUND

Thin-film-deposition equipments, such as chemical-vapor deposition (CVD), physical-vapor deposition (PVD) and the atomic-layer deposition (ALD) equipments, those are commonly employed in manufacturing process of semiconductors, light-emitting diodes and displays, etc.

A thin-film-deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field, then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

After some time of usage, an inner-edge surface of the chamber may also be formed with thin film, then a periodic cleaning is required to perform to the chamber, in order to prevent the waste thin film from dropping onto the substrate and causing pollution during the process of thin-film deposition. Moreover, surface of the target material may be formed with oxide or other pollutant, therefore requires a periodic cleaning as well. Generally, a burn-in process is applied to bombard the target material within the chamber by plasma ions, then to remove the oxides or pollutants on the surface of target material.

To perform the abovementioned cleaning process, the substrate carrier and the substrate must be extracted or kept out, to prevent the removed pollutant from turning to pollute the substrate carrier and the substrate, during the cleaning process.

SUMMARY

Generally, after some time of usage, the thin-film-deposition equipment is required for cleaning, in order to remove the waste thin film within the chamber and the oxide or nitride on the target material. During the cleaning process, some removed pollutant particles may turn to pollute the substrate carrier, thus there is a need to keep out the substrate carrier from the removed pollutant. The present disclosure provides a shielding device and a thin-film-deposition equipment with the same, which mainly employs a driver to rotate and swing two shield members in opposite angular directions to approach or leave each other, such that to operate between a shielding state and an open state. Thereby, the shield members in shielding state can cover and shield the substrate carrier, to prevent the removed pollutant particles from turning to pollute the substrate carrier during the process of cleaning the chamber or the target material.

An object of the present disclosure is to provide a thin-film-deposition equipment with shielding device, which includes a reaction chamber, a substrate carrier and a shielding device. The shielding device includes a driver and two shield members, wherein the driver interconnects and swings the shield members to move in opposite angular directions, such that to operate the shield members between an open state and a shielding state.

During a process of cleaning the reaction chamber, the driver swings the two shield members to approach each other, such that the two shield members come together to cover the substrate carrier within a containing space, in order to prevent a plasma employed to proceed the cleaning or some removed waste pollutant from turning to pollute the substrate carrier and/or the substrate thereon. Alternatively, during a process of performing the deposition, the driver swings the two shielding members to leave each other, such that to permit the process to proceed on the substrate within the reaction chamber.

Furthermore, the two shield members may be configured to overlap each other in the shielding state, such that to form a whole shield for a full coverage of the carrier against the pollutants. Moreover, the shield members overlap however do not contact each other, such that to prevent a collision or friction therebetween and creating wear-off particles to further pollute the reaction chamber.

An object of the present disclosure is to provide a thin-film-deposition equipment with shielding device, which employs two shield members that can combine to form a whole shield, thereby to improve space efficiency. In one embodiment, the two shield members sway in opposite angular directions within the containing space of the reaction chamber, wherein the two are operable between an open state and a shielding state within the reaction chamber, such that to improve space efficiency of the reaction chamber.

An object of the present disclosure is to provide a thin-film-deposition equipment with shielding device, wherein the driver interconnects the two shield members via two connecting arms, each of the connecting arms sustains a behalf of the shield member. Moreover, the two connecting arms may be configured to sustain thicker shield members, which are durable against deformation caused by high temperature, for better performance of the shield members.

To achieve the abovementioned object, the present disclosure provides a thin-film-deposition equipment, which includes: a reaction chamber including a containing space; a carrier disposed within the containing space for carrying at least one substrate thereon; and a shielding device. Furthermore, the shielding device includes: a first-shield member that is disposed within the containing space and that has a first-inner-edge surface disposed with at least one protrusion; a second-shield member that is disposed within the containing space and that has a second-inner-edge surface disposed with at least one cavity; and a driver that interconnects and drives the first-shield member and the second-shield member to respectively sway in opposite directions between an open state and a shielding state, wherein in the shielding state, the first-shield member and the second-shield member are adjacent to each other with the at least one protrusion of the first-shield member entering the at least one cavity of the second-shield member.

The present disclosure also provides a shielding device, which is adapted to thin-film-deposition equipment, and includes: a first-shield member that has a first-inner-edge surface disposed with at least one protrusion; a second-shield member that has a second-inner-edge surface disposed with at least one cavity; and a driver that interconnects and drives the first-shield member and the second-shield member to respectively sway in opposite directions between an open state and a shielding state, wherein in the shielding state, the first-shield member and the second-shield member are adjacent to each other with the at least one protrusion of the first-shield member entering the at least one cavity of the second-shield member.

Another object of the present disclosure is to provide the abovementioned shielding device and thin-film-deposition equipment, wherein the shielding device further includes two guard plates, for guarding the shield members from damage caused by high-temperature matters or the heat itself.

To achieve the abovementioned object, the present disclosure provides the aforementioned shielding device, which includes a first-guard plate disposed on a surface of the first-shield member; and a second-guard plate disposed a surface of the second-shield member, wherein the first-guard plate and the second-guard plate also can approach each other to cover the first-shield member and the second-shield member together.

Another object of the present disclosure is to provide the abovementioned Shielding device and thin-film-deposition equipment, wherein the shielding device includes two drivers (motors) respectively connected to the two shield members.

To achieve the abovementioned object, the present disclosure provides the aforementioned shielding device, wherein the driver includes: two shaft seal and two motors; and the two motors are connected to the first-shield member and the second-shield member via the two shaft seals.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
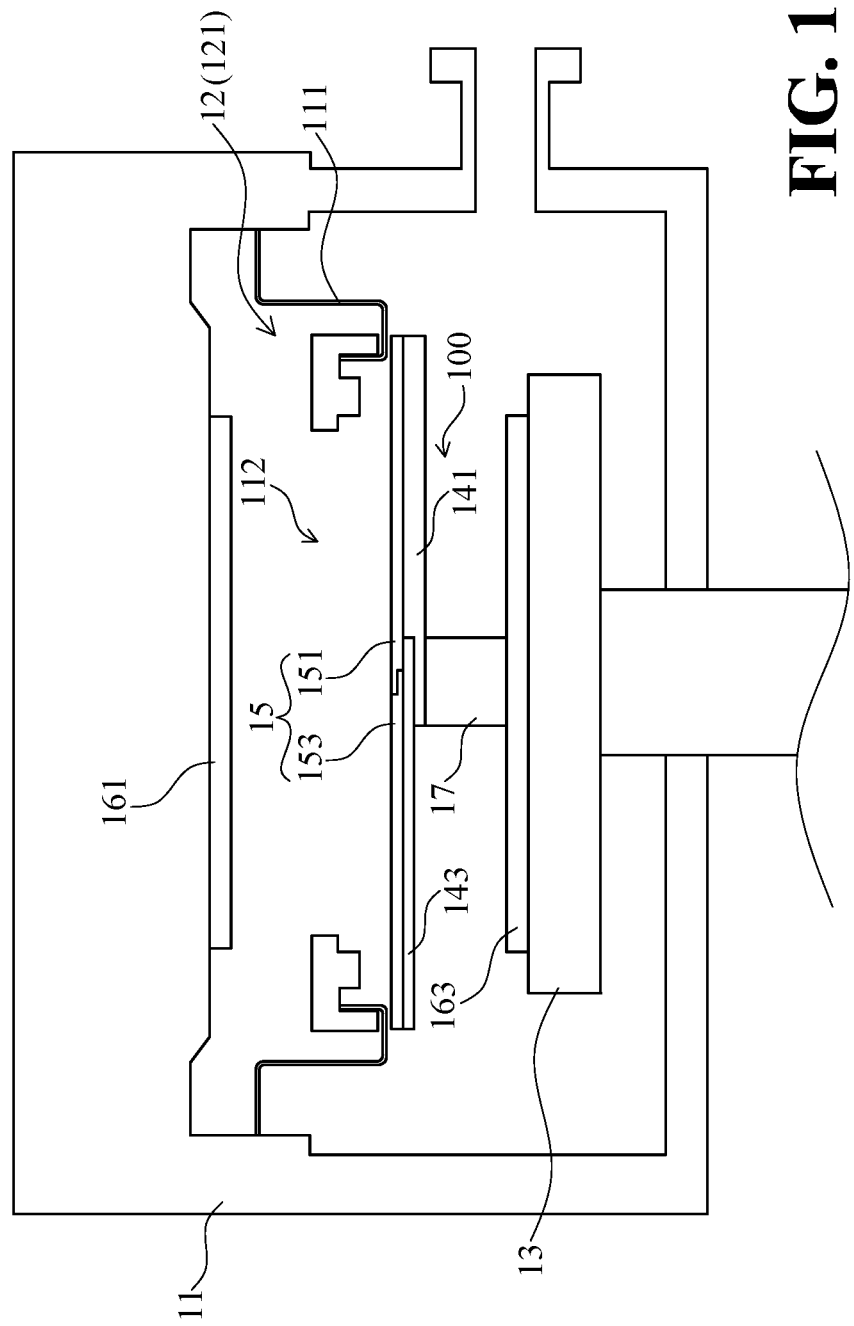
FIG. 1 is a schematic sectional view illustrating a shielding device of a thin-film-deposition equipment which is operated in a shielding state, according to one embodiment of the present disclosure.

Referring to FIG. 1, which is a schematic sectional view illustrating a shielding device 100 of a thin-film-deposition equipment 10 which is operated in a shielding state, according to one embodiment of the present disclosure. As shown in the FIG, the thin-film-deposition equipment 10 main includes a reaction chamber 11, a carrier 13 and a shielding device 100, wherein the reaction chamber 11 includes a containing space 12 for containing the carrier 13 and a portion of the shielding device 100.

The carrier 13 is positioned within the containing space 12 of the reaction chamber 11, for carrying at least one substrate 163. In this embodiment, the thin-film-deposition equipment 10 is exemplified as a physical-vapor deposition chamber. The reaction chamber 11 is disposed within a target material 161 and has the target material 161 facing the carrier 13. Specifically, the target material 161 may be disposed on a ceiling surface of the reaction chamber 11 to face the carrier 13 and/or the substrate 163 carried thereon within the containing space 12, for example.

Figure 2:
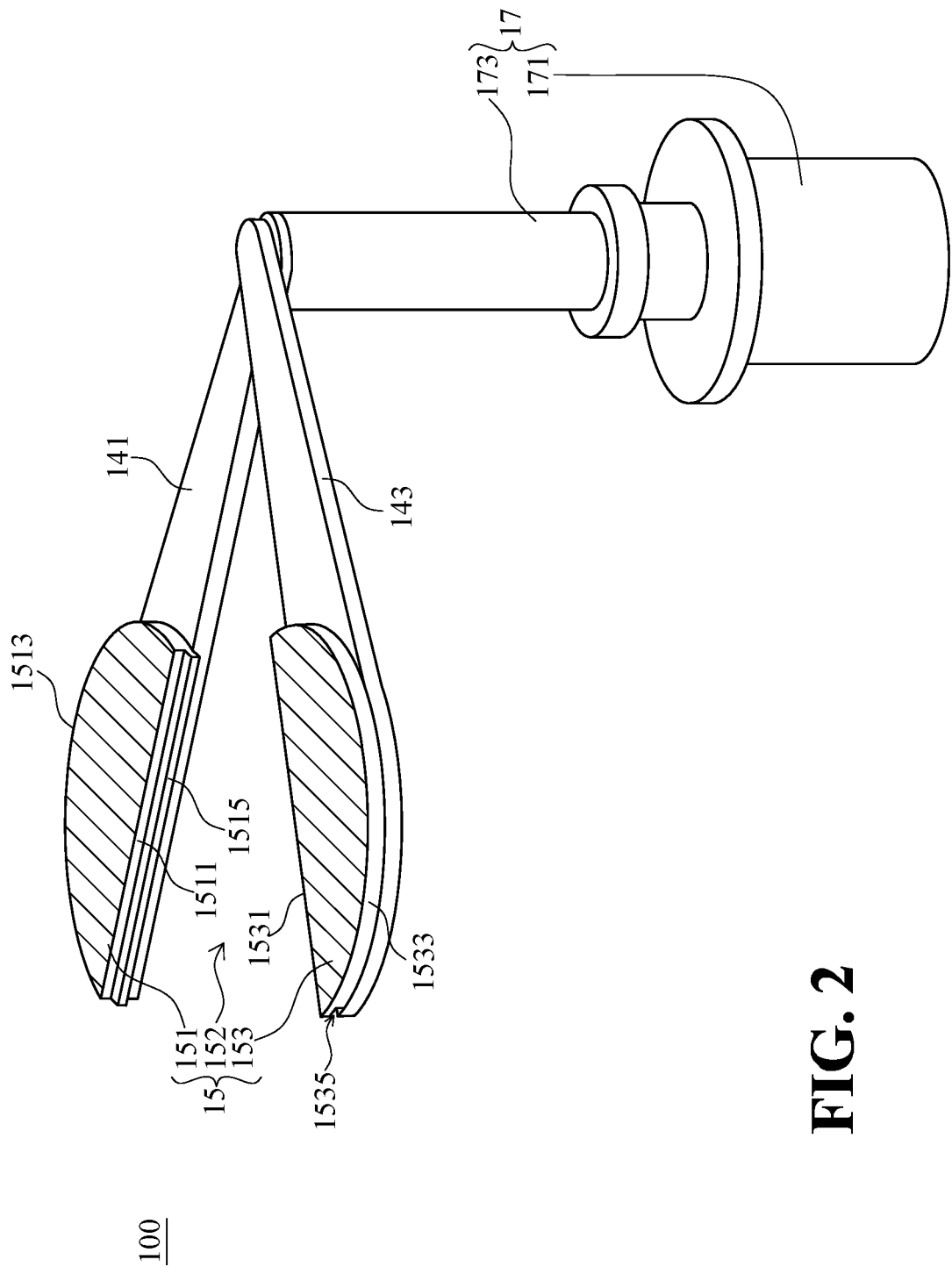
FIG. 2 is a schematic perspective view illustrating the shielding device which is operated in an open state, according to one embodiment of the present disclosure.
Figure 3:
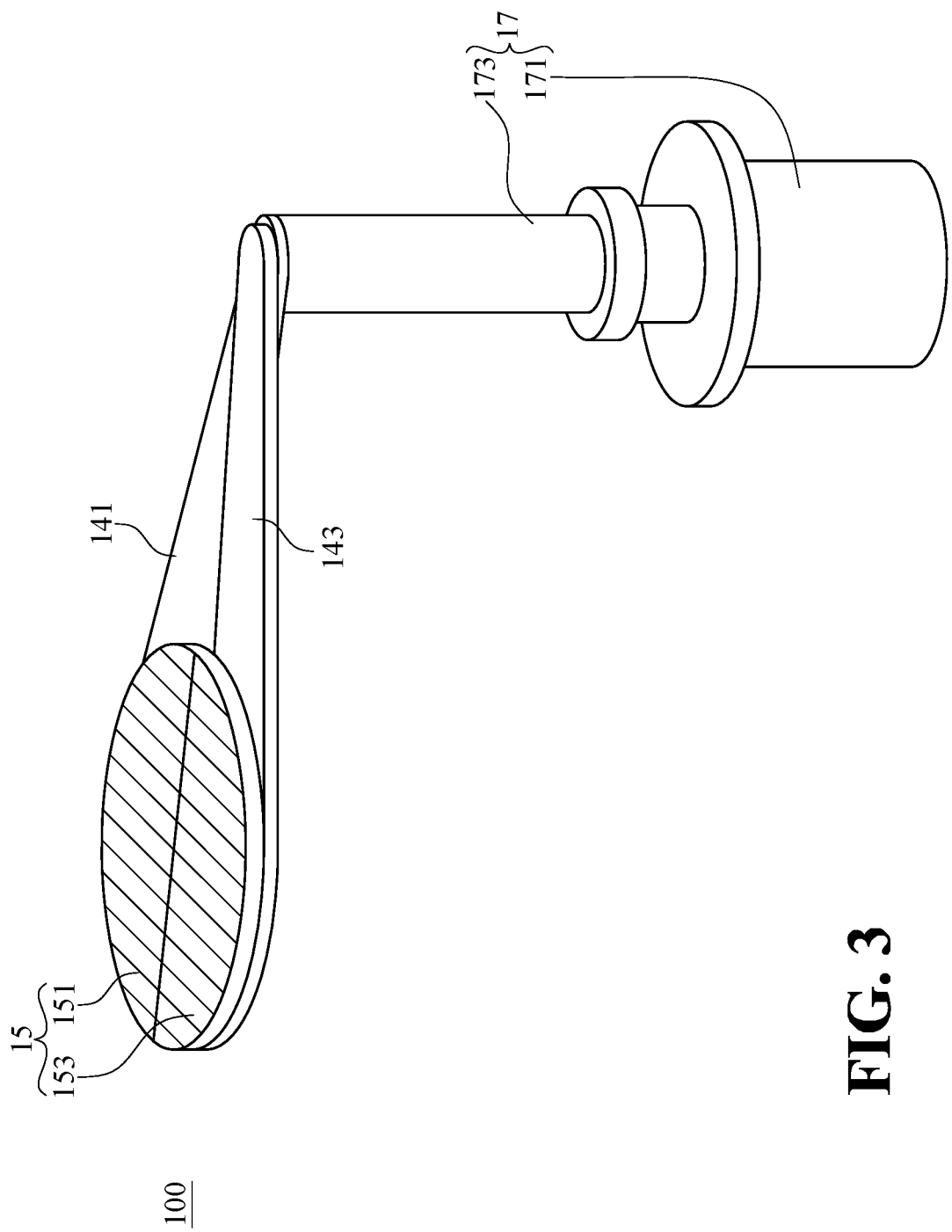
FIG. 3 is a schematic perspective view illustrating the shielding device which is operated in the shielding state, according to one embodiment of the present disclosure.
Figure 4:
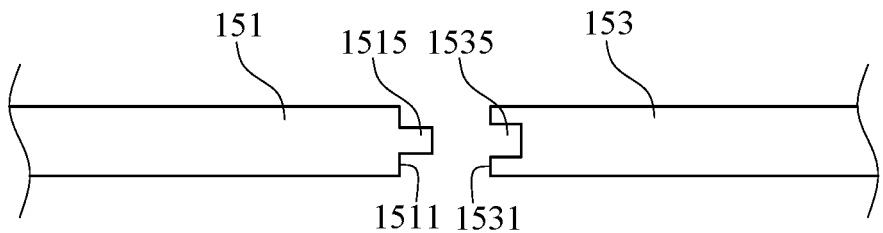
FIG. 4 is a schematic fragmentary sectional view illustrating the first-shield member and the second-shield member of the shielding device which are separate from each other, according to another embodiment of the present disclosure.

Referring to FIG. 2 and FIG. 3, the shielding device 100 includes a first-connecting arm 141, a second-connecting arm 143, a first-shield member 151 and a second-shield member 153 and a driver 17, wherein the first-connecting arm 141, the second-connecting arm 143, the first-shield member 151 and the second-shield member 153 are positioned within the containing space 12. The driver 17 interconnects the first-connecting arm 141 and the second-connecting arm 143, wherein the first-connecting arm 141 and the second-connecting arm 143 are for respectively carrying the first-shield member 151 and the second-shield member 153. With such structure, the driver 17 drives, swings the first-shield member 151 and the second-shield member 153 in opposite angular directions via the first-connecting arm 141 and the second-connecting arm 143, such as to have the first-shield member 151 and the second-shield member 153 swaying toward or away from each other synchronously, about an axle of the driver 17.

The first-shield member 151 and the second-shield member 153 may be formed as plates with similar shapes, such as respectively formed as one half and another half of a round plate. Such that, as the driver 17 swings the first-connecting arm 141 and the second-connecting arm 143 to respectively move the first-shield member 151 and the second-shield member 153 toward each other, the two members 151, 153 come together and form a whole round shield 15, for covering and shielding the carrier 13 and/or the substrate thereon.

As shown in FIG. 1, when the first-connecting arm 141 and the second-connecting arm 143 are driven by the driver 17 to move the first-shield member 151 and the second-shield member 153 approaching each other and forming the whole shield 15, for covering and shielding the carrier 13 from pollutants created during a later performed cleaning process.

Figure 5:
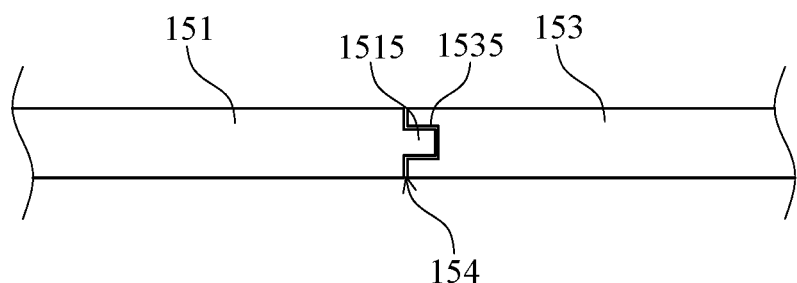
FIG. 5 is a schematic fragmentary sectional view illustrating the first-shield member and the second-shield member of the shielding device which are in the shielding state, according to another embodiment of the present disclosure.

To be more specific, in this embodiment, the first-shield member 151 and the second-shield member 153 can be operated to move into a shielding state, which is defined as the first-shield member 151 and the second-shield member 153 continue to approach each other, until a distance between the two members 151, 153 is less than a threshold value, such as 1 millimeter (mm), to form a gap space 154, as shown in FIG. 5. To be specific, the first-shield member 151 and the second-shield member 153 do not actually contact each other, such that to avoid a collision or friction therebetween, which may create some wear-off particles therefrom to pollute the containing space 12 of the reaction chamber 11 and/or the carrier 13 therein.

As shown in FIG. 2 and FIG. 3, the first-shield member 151 and the second-shield member 153 formed with similar, half-round shapes and area sizes, which is merely one embodiment of the present disclosure, therefore claim scope of the present disclosure is not limited thereto. In practical use, the first-shield member 151 and the second-shield member 153 may be formed with different area sizes and shapes, such rectangular plates, ellipse plates or plates in any other geometric shape, moreover, the first-shield member 151 may have an area size larger than that of the second-shield member 153. What is essential for the claim scope of the present disclosure is that, two shield members which can approach each other to form the whole shield 15 for covering the carrier and/or substrate 163 thereon.

For this embodiment, the first-shield member 151 and the second-shield member 153 are both formed as half-round plates, each of the shield member 151, 153 is formed with a straight, flat inner-edge surface 1511, 1531, and also formed with a curved outer-edge surface 1513, 1533. Moreover, the inner-edge surface of the first-shield member 151 and the inner-edge surface of the second-shield member 153 correspond to each other. When the driver 17 drives and swings the connecting arms 141, 143 to move the first-shield member 151 and the second-shield member 153 toward each other, the two shield members 151, 153 then come together and form the whole round shield 15, also to have the two inner-edge surfaces 1511, 1531 thereof facing each other. However, the claim scope of the present disclosure is not limited to such straight and flat inner-edge surfaces of the shield members 151, 153, in practical use, the inner-edge surfaces may be formed in concave and convex shapes or zig-zag shapes corresponding to each other, it is only sufficient to have the inner-edge surfaces of the two shield members to approach and be adjacent to each other, for effectively cover the carrier 13.

In more detail, the first-shield member 151 has at least one protrusion 1515 formed on the first-inner-edge surface 1511, in the other hand, the second-shield member 153 has at least one cavity 1535 formed on the second-inner-edge surface 1531. Furthermore, the protrusion 2515 on the first-inner-edge surface 2512 is formed corresponding to the cavity 2535 on the second-inner-edge surface 2532, and the protrusion 1515 is formed slightly smaller than the cavity 1535.

Figure 6:
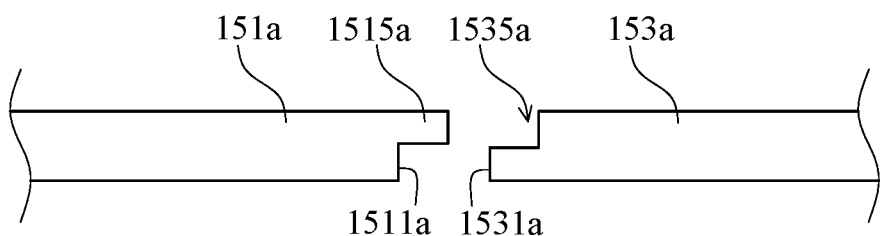
FIG. 6 is a schematic fragmentary sectional view illustrating the first-shield member and the second-shield member which are separate from each other, according to another different embodiment of the present disclosure.

As shown in FIG. 2-FIG. 5, the protrusion 1515 is positioned at middle of the first-inner-edge surface 1511 on the first-shield member 151, the cavity 1535 is also positioned at middle of the second-inner-edge surface 1531 on the second-shield member 153. However, in another different embodiment as shown in FIG. 6, the protrusion 1515a may be positioned at an upper portion of the first-inner-edge surface 1511a of the first-shield member 151a, and the cavity 1535a may also be positioned at an upper portion of the second-inner-edge surface 1531a.

As shown in FIG. 5, in this original embodiment, when the first-shield member 151 and the second-shield member 153 are operated in the shielding state, between the first-shield member 151 and the second-shield member 153, the first-inner-edge surface 1512 and the second-inner-edge surface 1532 are adjacent to each other and maintain the gap space 154, furthermore, the protrusion 1515 on the first-inner-edge surface 1511 enters the cavity 1535 on the second-inner-edge surface 1531 but still maintain the gap space 154 therebetween.

Figure 7:
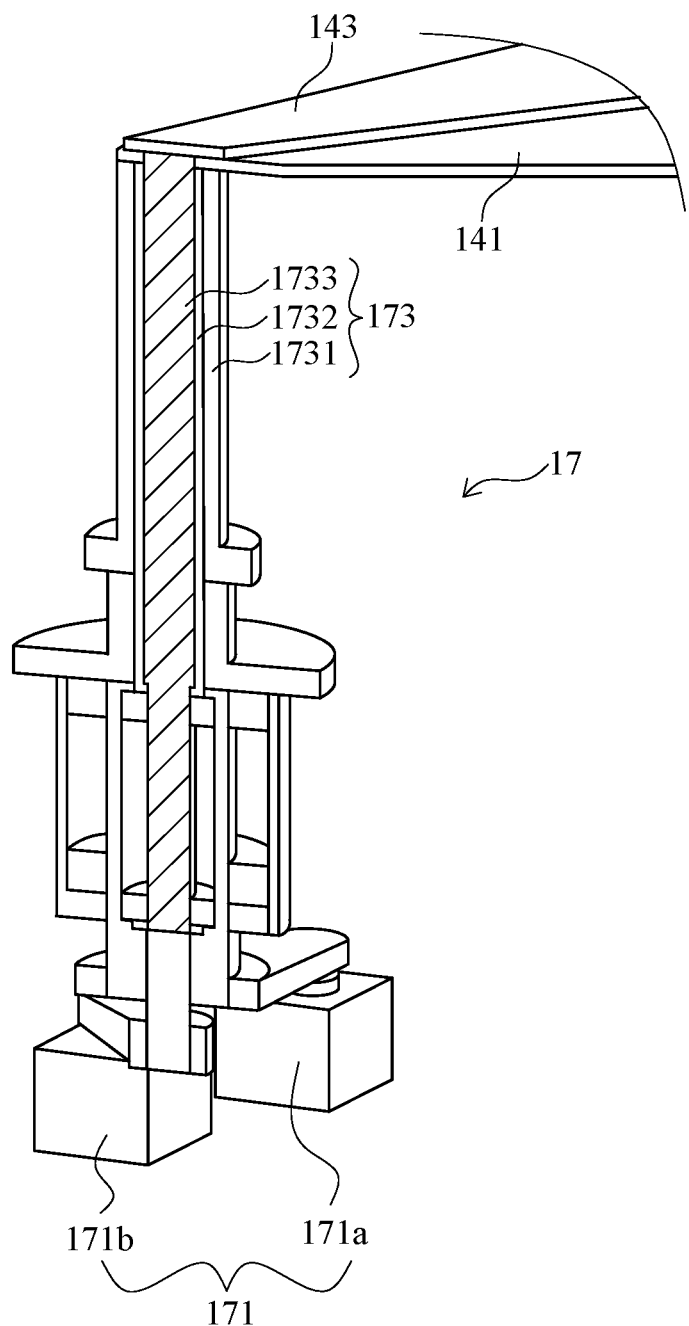
FIG. 7 is a schematic perspective sectional view illustrating a driver of the shielding device, according to one embodiment of the present disclosure.

In one embodiment of the present disclosure as shown in FIG. 7, the driver 17 includes at least one motor 171 and a shaft seal 173, wherein the motor 171 is connected to the first-shield member 151 and the second-shield member 153 via the shaft seal 173. The motor 171 is positioned outside of the containing space 12 within the reaction chamber 110. The shaft seal 173 extends from the motor 171 and into the reaction chamber 110, and hence partially disposed within the containing space 12.

Specifically, the shaft seal 173 includes an outer tube 1731 and a main shaft 1733. The outer tube 1731 has an inner space 1732 for containing the main shaft 1733, wherein the outer tube 1731 and the main shaft 1733 are disposed concentrically. Moreover, the outer tube 1731 and the main shaft 1733 can be driven by the motor 171 to rotate relative to each other. The outer tube 1731 is connected to the first-connecting arm 141, and such that able to swing the first-connecting arm 141 to hence move the first-shield member 151. The main shaft 1733 is connected to the second-connecting arm 143, and such that able to swing the second-connecting arm 143 to hence move the second-shield member 153.

The shaft seal 173 may be a common shaft seal component, which is mainly for isolating the containing space 12 of the reaction chamber 110 from an outside thereof and maintaining a vacuum condition within the containing space 12. In a different embodiment of the present disclosure, the shaft seal 173 may be a magnetic liquid rotary sealing, which includes a plurality of bearings, at least one permanent magnet, at least one pole piece and at least one ferrofluid, etc. assembled together.

In one embodiment of the present disclosure as shown in FIG. 7, the motor 171 may be two, as a first motor 171a and a second motor 171b respectively connected to the outer tube 1731 and the main shaft 1733 of the shaft seal 173, to drive the outer tube 1731 and the main shaft 1733 to rotate in opposite directions, such that to swing and move the first-shield member 151 and the second-shield member 153 in the opposite directions via the outer tube 1731 and the main shaft 1733.

Alternatively, in a different embodiment of the present disclosure, the motor 171 may be just one with a drive mechanism (e.g. gear system or linkage system, etc.), such that to drive, swing the first-connecting arm 141 and the second-connecting arm 143 and to further move the first-shield member 151 and the second-shield member 153 in the opposite directions.

Figure 8:
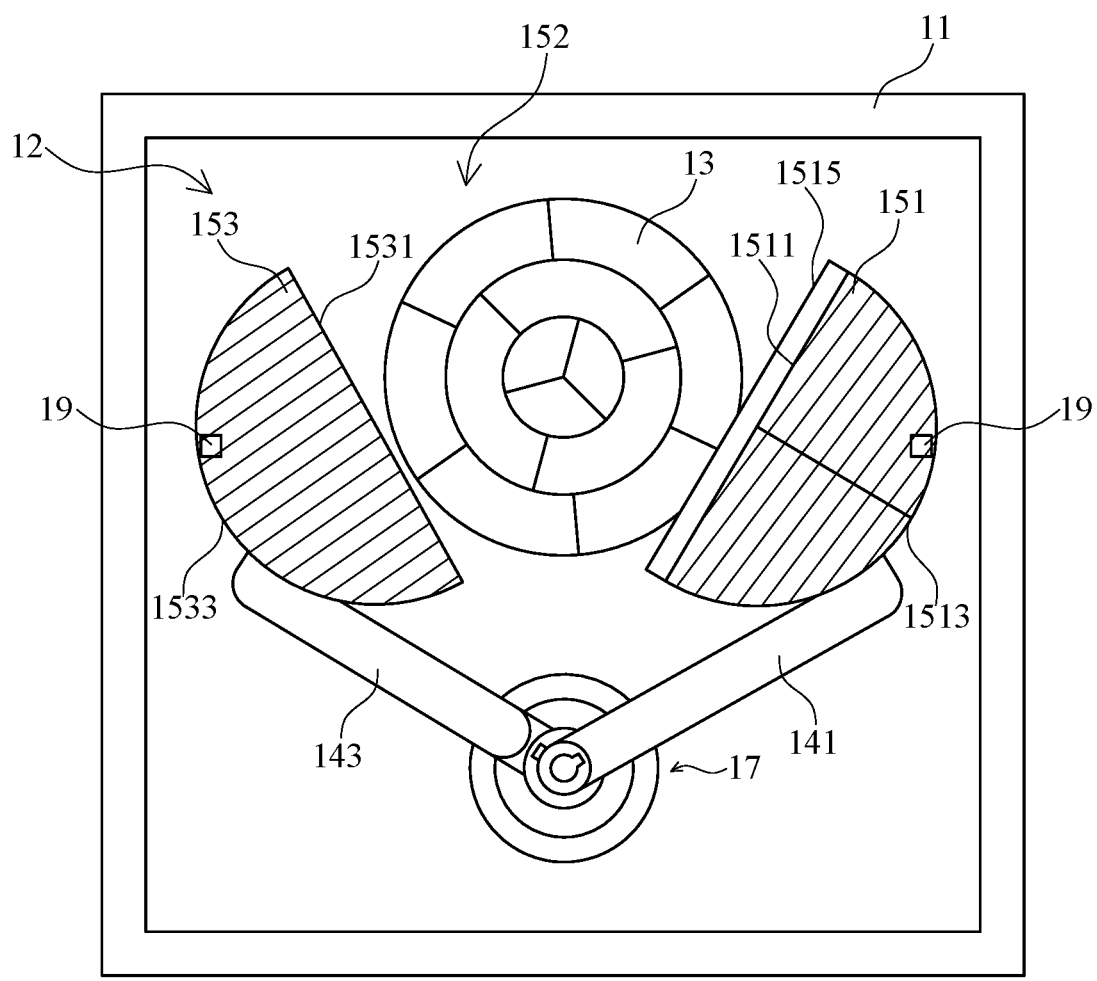
FIG. 8 is a schematic top view illustrating the shielding device of the thin-film-deposition equipment which in the open state, according to one embodiment of the present disclosure.

In more detail, Thin-film-deposition equipment 10 and/or the shielding device 100 according to the present disclosure, which can be operated to switch between two states as an open state and a shielding state. As shown in FIG. 1 and FIG. 8, the driver 17 can drive, swing the first-shield member 151 and the second-shield member 153 to move in the opposite directions, such that the first-shield member 151 and the second-shield member 153 leave each other and move into the open state. In the open state, the first-shield member 151 and the second-shield member 153 have an open space 152 therebetween, such that the first-shield member 151 and the second-shield member 153 do not get between the target material 161 and the carrier 13 with the substrate 163 thereon.

When the first-shield member 151 and the second-shield member 153 are operated into the open state, the carrier 13 can be driven by the elevating unit to approach the target material 16. Thereafter, a process gas (e.g. noble gas) is employed to bombard the target material 16, in order to remove and deposit particles (e.g. atoms or molecules) of the target material 16 and form a thin film on a surface of the substrate carried on the carrier 13.

In the embodiment as shown in FIG. 1, the containing space 12 of the reaction chamber 11 is disposed with a tubular blocking member 111, which has one end connected to the ceiling surface of the reaction chamber 11, and another end formed with an opening 112. Such that, when the carrier 13 approaches the target material 161, the carrier 13 also enters the opening 112 or contacts the blocking 111. The reaction chamber 11, the carrier 13 and the blocking member 111 together define a reactive space within the containing space 12, for forming the thin film on the substrate within the reactive space, such that to prevent the blew-off particles of the target material 161 from spreading out of the reactive space and forming undesired thin film outside.

Figure 9:
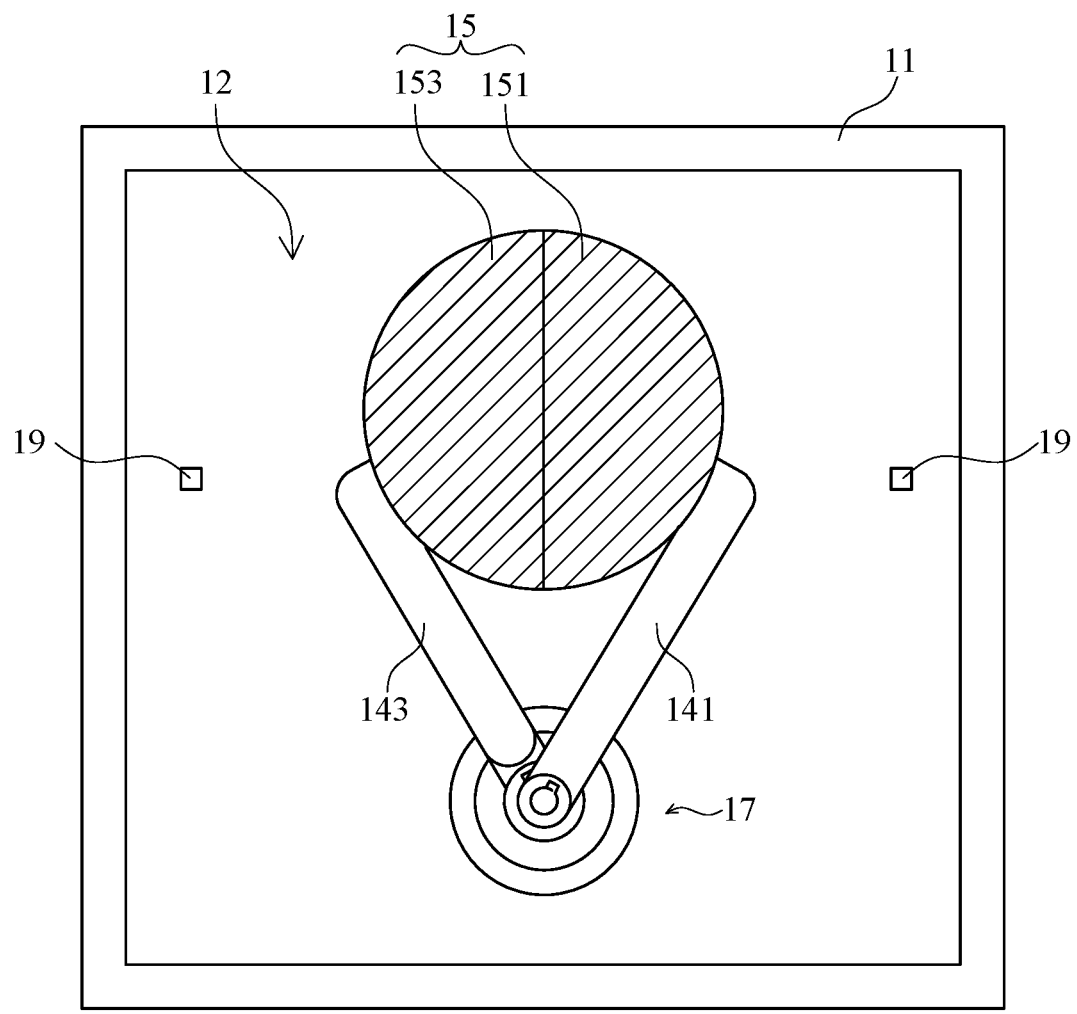
FIG. 9 is a schematic top view illustrating the shielding device of the thin-film-deposition equipment which is in the shielding state, according to one embodiment of the present disclosure.

In the opposite manner, as shown in FIG. 3 and FIG. 9, the driver 17 can drive, swing the first-shield member 151 and the second-shield member 153 to approach each other and move into the shielding state. In the shielding state, the first-shield member 151 and the second-shield member 153 come together and form the whole shield 15 between the target material 161 and the carrier 13, such that to cover and shield the carrier 13 from the target material 161.

As shown in FIG. 1, the shield 15 and the blocking member 111 together can define a cleaning space 121 within the containing space 12, wherein the cleaning space 121 and the aforementioned reactive space have partially or completely spatial overlap. A burn-in process may be performed within the cleaning space 121, to clean the target material 161, the ceiling surface of the reaction chamber 110 and/or an inside of the blocking member 111, and to remove oxides, nitrides or other pollutants on the target material 161, also to remove undesired, waste thin film within the reaction chamber 110 and/or the blocking member 111.

In one embodiment of the present disclosure as shown in FIG. 8 and FIG. 9, the reaction chamber 11 and/or the containing space 12 may be configured to have a relatively large size, which is sufficient for accommodating the two shield members 151, 153 in the open state, therefore no need of additional containers for storing the shield members 151, 153.

In one embodiment of the present disclosure, the reaction chamber 11 may be further disposed with a plurality of position sensors 19 (e.g. optical sensors) within the containing space 12, for respectively detecting locations the first-shield member 151 and the second-shield member 153. The position sensors 19 are configured to confirm that the first-shield member 151 and the second-shield member 153 are in the open state, thereby to avoid undesired interference, collisions between those movable components as the two connecting arms 141, 143 and the two shield members 151, 152 and the carrier 13.

In practical use, according to how the other components, mechanisms and movements thereof in the thin-film-deposition equipment 10 are arranged, the shielding device 100 may be disposed at different locations within the reaction chamber 11. For this embodiment as shown in FIG. 8 and FIG. 9, as the containing space 12 of the reaction chamber 11 is substantially formed with a rectangular cross-section, the driver 17 of the shielding device 100 may be disposed at a side of the reaction chamber 11 and/or the containing space 12. Alternatively, in other embodiments (similar to an embodiment of FIG. 10), the driver 17 of the shielding device 100 may be disposed on or near by a corner of the reaction chamber 11 and/or the containing space 12, such that the reaction chamber 11 can be further disposed with substrate passages or gas-extraction pipelines (not shown) at lateral sides thereof.

Figure 10:
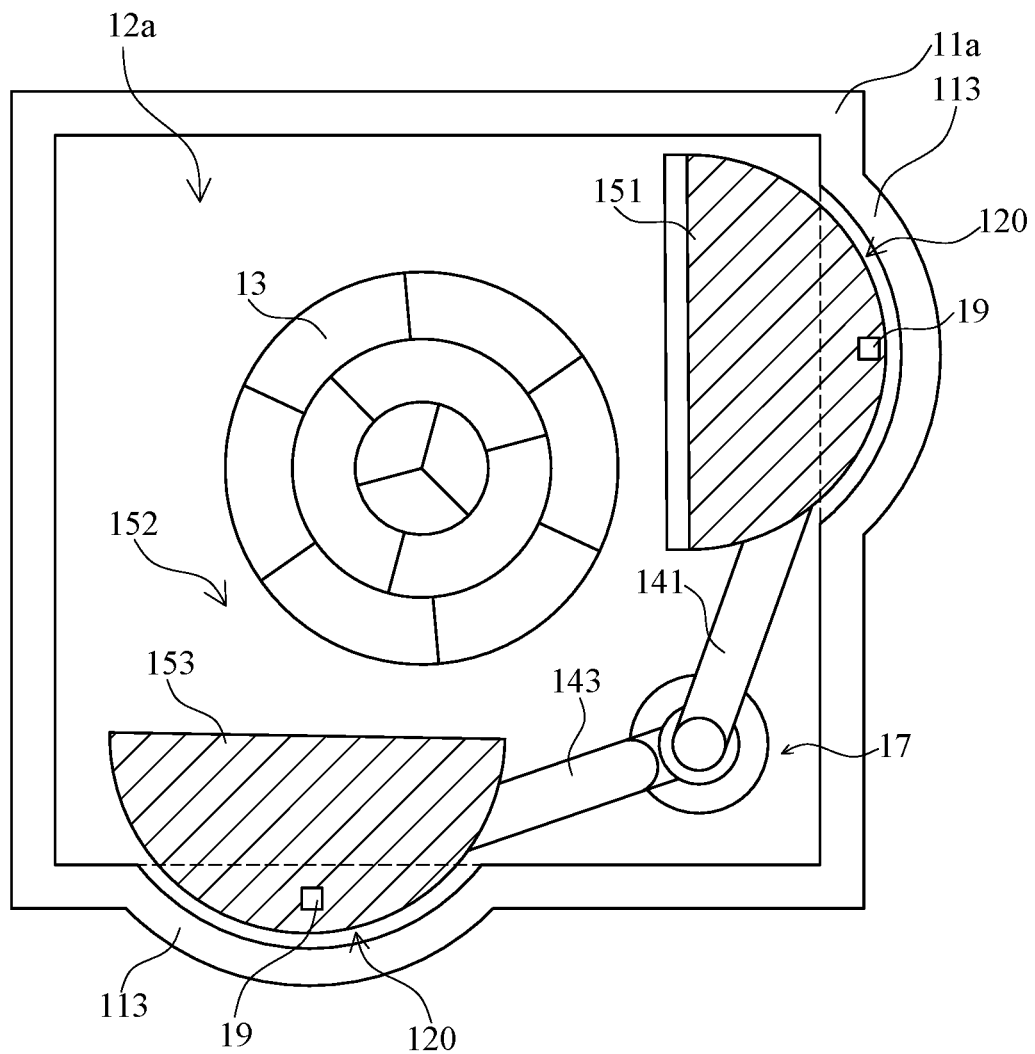
FIG. 10 is a schematic top view illustrating the shielding device of the thin-film-deposition equipment which in is the open state, according to a different embodiment of the present disclosure.

In the embodiment as shown in FIG. 10, the reaction chamber 11a may be respectively disposed with two sensor areas 113 which are respectively connected to two sides thereof, wherein each of the sensor areas 113 has a height shorter than that of the reaction chamber 11a. Furthermore, each of the sensor areas 113 is formed with a sensing space 120 therein which is spatially and fluidly connected to the containing space 12 of the reaction chamber 11a, for partially containing the first-shield member 151 and the second-shield member 153 respectively when the two shield members 151 are operated into the open state. Also to mention that when in the open state, each of the first-shield member 151 and the second-shield member 153 has a relatively small portion within the corresponding sensing space 120, and relatively large portion remaining within the containing space 12.

Moreover, each of the sensing spaces 120 of the sensor areas 113 are disposed with at least one position sensor 19, for respectively detecting and confirming that the two shield members 151, 153 have entered the sensing spaces 120 and in the open state. Also to mention that in this embodiment, the driver 17 is disposed on or near by a corner of the reaction chamber 11 and/or the containing space 12, and the two sensor areas 113 are respectively disposed on two adjacent sides of the reaction chamber 11, to facilitate disposing substrate passages or gas-extraction pipelines on the reaction chamber 11. However surely, in other different embodiment, the driver can be configured to dispose on a side of the reaction chamber 11 and/or the containing space 12, and the two sensor areas can be respectively disposed on two opposite sides of the reaction chamber 11.

Figure 11:
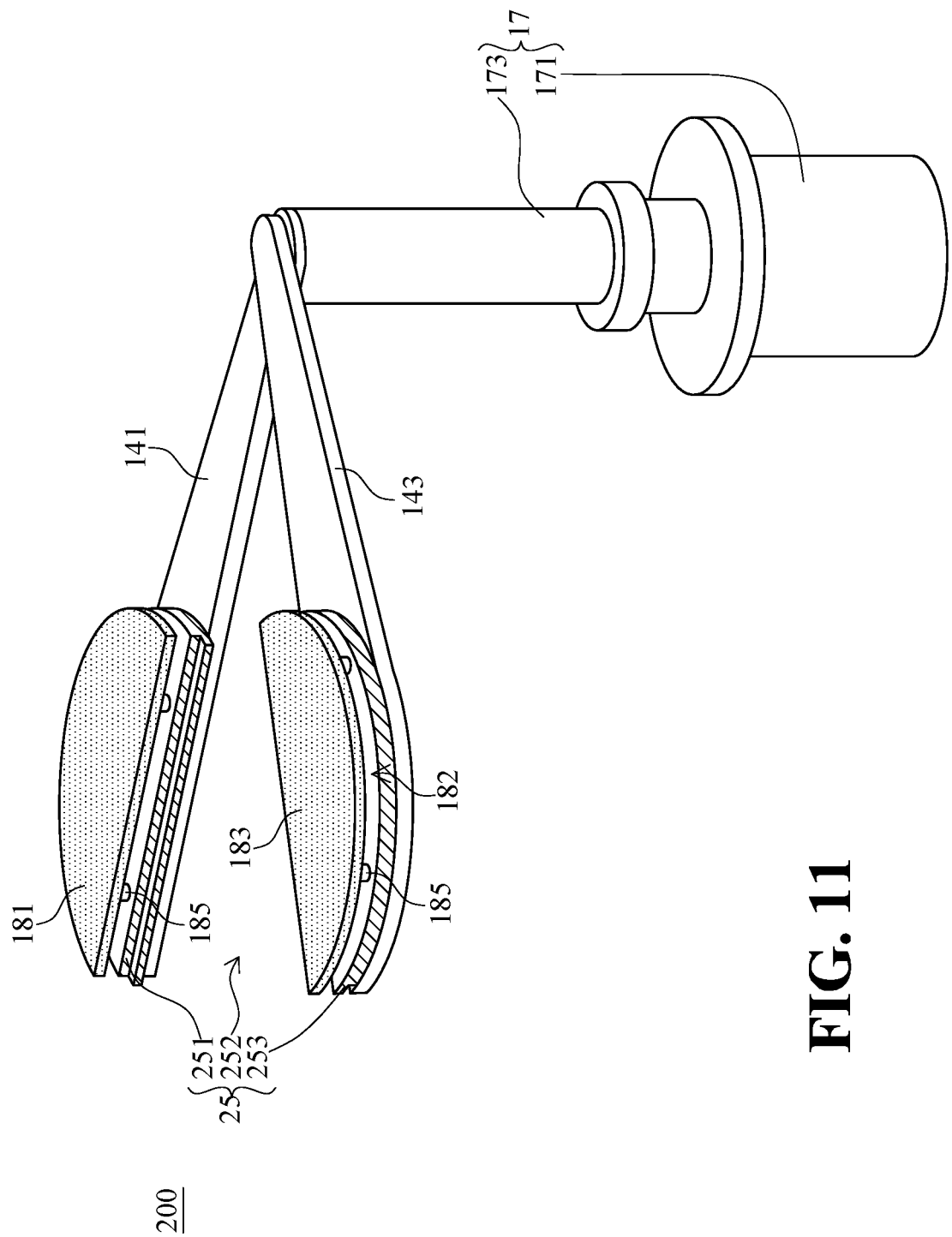
FIG. 11 is a schematic perspective view illustrating the shielding device of the thin-film-deposition equipment which is in the open state, according to another embodiment of the present disclosure.
Figure 12:
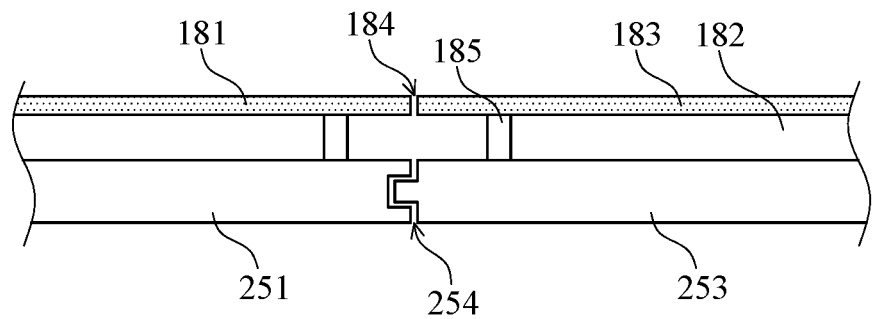
FIG. 12 is a schematic fragmentary sectional view illustrating the first-shield member and the second-shield member of the shielding device which are in the shielding state, according to yet another embodiment of the present disclosure.

Referring to FIG. 11 and FIG. 12, wherein FIG. 11 is a schematic perspective view illustrating the shielding device 200 of the thin-film-deposition equipment which is in the open state, and FIG. 12 is a schematic fragmentary sectional view illustrating the first-shield member 251 and the second-shield member 253 of the shielding device 200 which are in the shielding state, according to yet another embodiment of the present disclosure. In comparison with the aforementioned embodiments, the shielding device 200 in this embodiment, which includes a first-guard plate 181 and a second-guard plate 183 respectively disposed on the first-shield member 251 and the second-shield member 253. With such structure, as the driver 17 drives, swings the connecting arms 141, 143 to move second-shield members 251, 253 toward each other into the shielding state, the first-guard plate 181 and the second-guard plate 183 also come together to get between the shield members 251, 253 and the target material 161, to provide further coverage and protection for the shield members 251, 253.

The guard plates 181, 183 mainly serve to block the high-temperature matters or the heat created during the process of cleaning the reaction chamber 11 and the target material 161, from directly contacting the shield members 251, 253, such that to prevent thermal deformation and malicious effect occurring thereto.

Also to mention that, when the shield members 251, 253 are in the shielding state, the guard plates 181, 183 do not contact each other neither, in order to avoid a collision or friction therebetween from creating wear-off particles and hence to pollute the containing space 12 and/or the carrier 13 within the reaction chamber 11. Such that, as shown in FIG. 12, when the shield members 251, 253 are in the shielding state, the shield members 251, 253 maintain a first gap space 254 therebetween, the guard plates 181, 183 also maintain a second gap space 184 therebetween, wherein first gap space 254 and second the gap space 184 have some spatial overlap, in this embodiment. Moreover, the first-shield member 251 and the first-guard plate 181 both may be formed with similar half-round shapes and area sizes, and so do the second-shield member 253 and the second-guard plate 183.

In one embodiment of the present disclosure, the guard plates 381, 383 are connected to the shield members 351, 353 via a plurality of support units 385, and thereby a gap 382 is respectively formed between the first-guard plate 381 and the first-shield member 351, and between the second-guard plate 383 and the second-shield member 353. The gaps 382 can serve prevent the high temperature generated during the cleaning process from directly transferring from the guard plates 381, 383 into the shield members 351, 353, such that to further prevent the thermal deformation of the shield members 351, 353.

Figure 13:
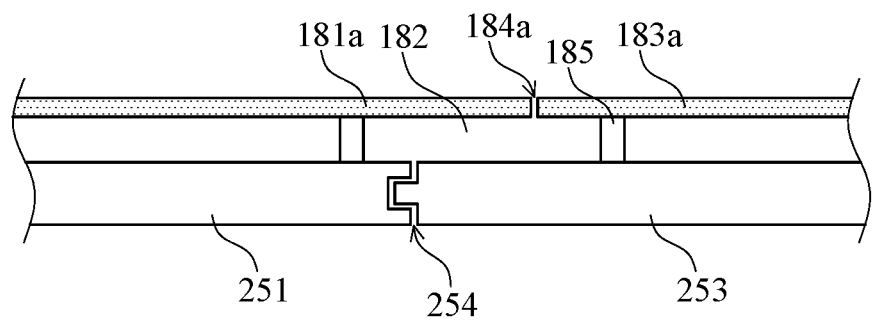
FIG. 13 is a schematic fragmentary sectional view illustrating the first-shield member and the second-shield member of the shielding device which are in the shielding state, according to yet another different embodiment of the present disclosure.

In yet another embodiment of the present disclosure, as shown in FIG. 13, the guard plates 181a, 183a and the shield members 251, 253 may be configured to have the first gap space 254a and the second gap space 184a not spatially overlap each other. In this embodiment, the two shield members 251, 253 have substantially identical area sizes, whereas the two guard plates 181a, 183a have different area sizes, such as the first-guard plate 181a may be formed larger than the second-guard plate 183a. However surely, in practical use, it may also be configured into an opposite manner, such as the two shield members 251, 253 have different area sizes, whereas the two guard plates 181a, 183a have substantially identical area sizes, which makes no spatial overlap between the first gap space 254a and the second gap space 184a as well.

When the first gap space 254 has no spatial overlap with the second gap space 184a, the high-temperature matters and the heat of the cleaning process is prevented from directly passing through the second gap space 184a then the first gap space 254, and then to reach the carrier 13, thereby to improve the coverage for the carrier 13 and/or the substrate 163.

Figure 14:
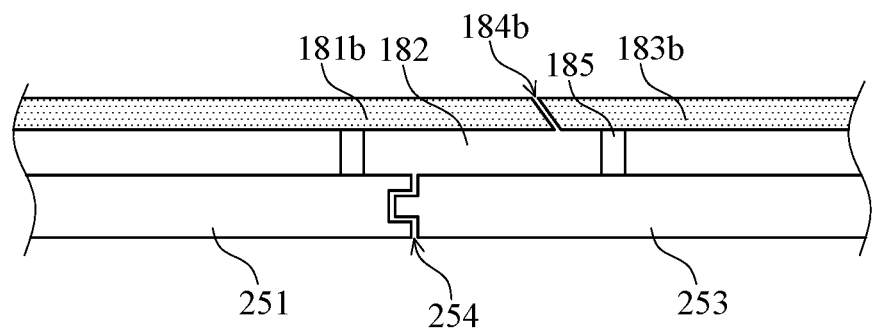
FIG. 14 is a schematic fragmentary sectional view illustrating the first-shield member and the second-shield member of the shielding device which are in the shielding state, according to one other different embodiment of the present disclosure.
Figure 15:
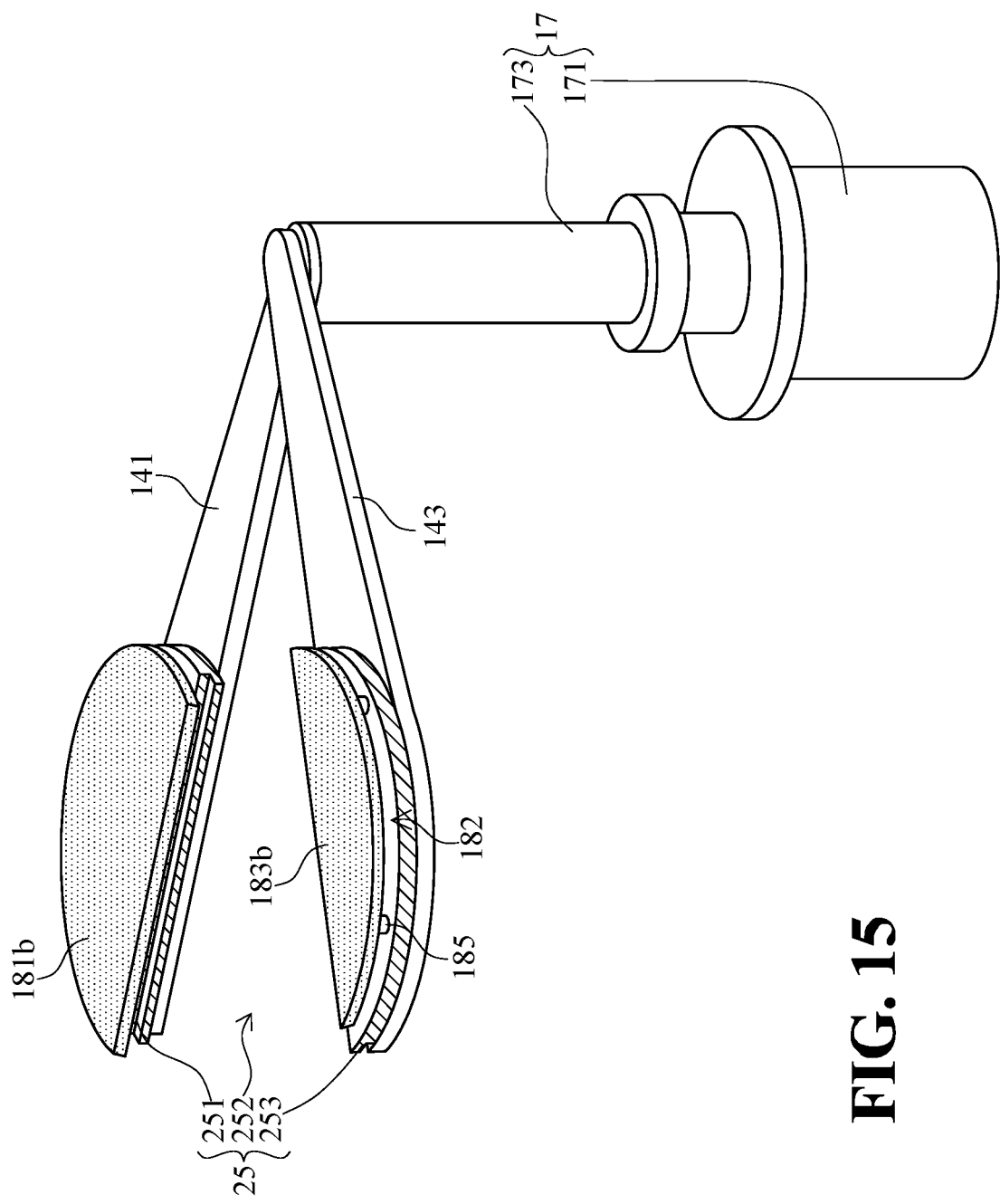
FIG. 15 is a schematic perspective view illustrating the shielding device of the thin-film-deposition equipment which is in the open state, according to one other different embodiment of the present disclosure.

As shown in FIG. 14 and FIG. 15, in another different embodiment of the present disclosure, each of the two guard plates 181b, 183b has an inner-edge surface formed inclined relative to a top surface (upside of FIG. 14) and a bottom surface (downside of FIG. 15) thereof, wherein the inner-edge surfaces of the two guard plates 181b, 183b are also substantially parallel to each other. With such structure, when the two shield members 251, 253 are operated into the shielding state, the inner-edge surfaces of the two guard plates 181b, 183b face each other and form the second gap space 184b in an inclined manner relative to the first gap space 254 between the two shield members 251, 253, such that to tilt away from the second gap space 184b for preventing the pollutant from passing through and entering the first gap space 254, in a more effective manner.

In a different embodiment of the present disclosure, the first-guard plate 181 and the second-guard plate 183 can be formed with different heights, such as to have the first-guard plate 181 taller than the second-guard plate 183. Such that, when in the shielding state, the first-guard plate 181 partially covers a top of the second-guard plate 183 and overlaps therewith, thereby to improve the coverage for the carrier 13 and/or the substrate 163.

Surely, along with the shield members 251, 253 that may be formed in different shapes, the guard plates 181, 183 may also be formed in any geometric shapes.

Figure 16:
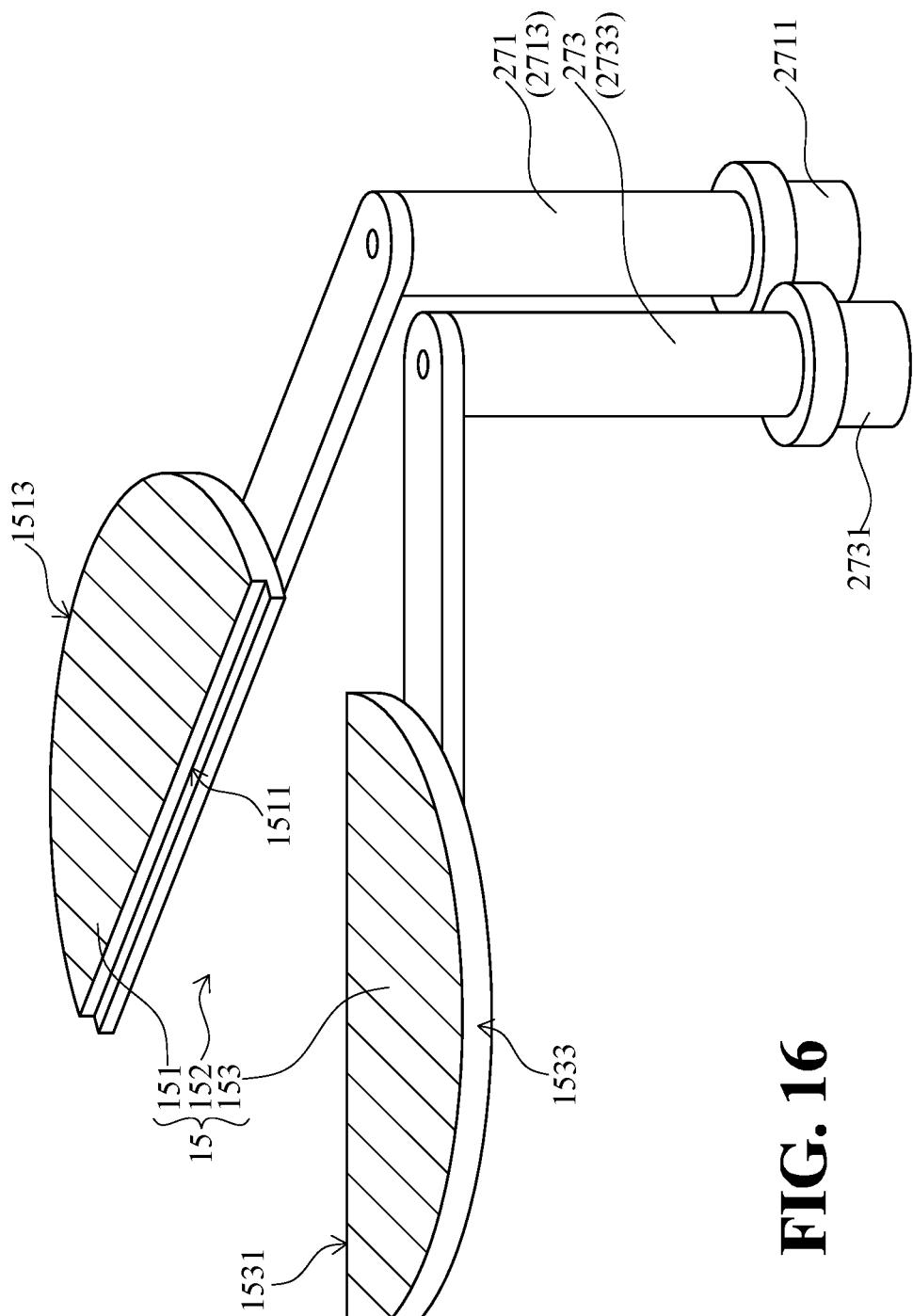
FIG. 16 is a schematic perspective view illustrating the shielding device of the thin-film-deposition equipment which is in the open state, according to one more embodiment of the present disclosure.

Referring to FIG. 16, which is a schematic perspective view illustrating the shielding device 300 of the thin-film-deposition equipment which is in the open state, according to one more embodiment of the present disclosure. In comparison with the aforementioned embodiment, the driver 27 in this embodiment is configured as a first driver 271 and a second driver 273, wherein the first driver 271 includes a motor 2711 and a shaft seal 2713, the second driver 273 includes a motor 2731 and a shaft seal 2733. The first driver 271 has the motor 2711 power-transmittably connected to the first-shield member 151 via the shaft seal 2713, in the other hand, the second driver 273 has the motor 2731 power-transmittably connected to the second-shield member 253 via the shaft seal 2733. Thereby, the first driver 271 and the second driver 273 drive and swing the first-shield member 151 and the second-shield member 153 to move in the opposite directions. For example, the first-shield member 151 and the second-shield member 153 may synchronously sway in the opposite directions, respectively about an axle of the shaft seal 2713 of the first driver 271 and an axle of shaft seal 2733 of the second driver 273.

To be specific, the first driver 271 and the second driver 273 can respectively drive, swing the first-shield member 151 and the second-shield member 153 to move away from each other into the open state, or to move toward each other into the shielding state.

Also, in this embodiment, the motor 2711 and shaft seal 2713 of the first driver 271, and the motor 2731 and shaft seal 2733 of the second driver 273, which all are structures similar to the motor 171 and shaft seal 173 in the aforementioned embodiment.

Moreover, similar to the aforementioned embodiments, in practical use, the first driver 271 and the second driver 273 may be connected to the first-shield member 151 and the second-shield member 153, respectively via the first-connecting arm 141 and the second-connecting arm 143.

Surely, the first driver 271 and the second driver 273 may be configured to respectively connect to and drive the aforementioned first-shield member 251 and the second-shield member 252 with the first-guard plate 181 and the second-guard plate 183 thereon, to switch between the open state and the shielding state as well.

For more, in other embodiment, the two drivers 271, 273 may be disposed at or near by a corner of the containing space 12 or the reaction chamber 11, such that to allow the passage for the substrate or the gas-extraction pipeline disposed at the edge side of the containing space 12 or the reaction chamber 11.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A thin-film-deposition equipment, comprising:
   a reaction chamber comprising a containing space;
   a carrier disposed within the containing space for carrying at least one substrate thereon; and
   a shielding device comprising:
      a first-shield member that is disposed within the containing space and that has a first-inner-edge surface disposed with at least one protrusion;
      a second-shield member that is disposed within the containing space and that has a second-inner-edge surface disposed with at least one cavity corresponding to the at least one protrusion of the first-inner-edge surface of the first-shield member; and
      a driver that interconnects and drives the first-shield member and the second-shield member to respectively sway in opposite directions between an open state and a shielding state, wherein in the shielding state, the first-inner-edge surface of the first-shield member and the second-inner-edge surface of the second-shield member are adjacent to each other with the at least one protrusion of the first-shield member entering the at least one cavity of the second-shield member, such that the first-shield member and the second-shield member together cover the carrier.

2. The thin-film-deposition equipment according to claim 1, wherein the driver comprises a shaft seal and at least one motor, and the at least one motor is connected to the first-shield member and the second-shield member via the shaft seal.

3. The thin-film-deposition equipment according to claim 2, wherein the shaft seal comprises an outer tube and a main shaft; the outer tube has an inner space for containing the main shaft; the at least one motor is connected to the first-shield member via the outer tube, and connected the second-shield member via the main shaft, such that to synchronously drive the outer tube and the main shaft to rotate in the opposite directions respectively.

4. The thin-film-deposition equipment according to claim 1, further comprising two sensor areas connected to the reaction chamber, wherein each of the sensor areas has a sensing space fluidly connected to the containing space of the reaction chamber for respectively and partially containing the first-shield member and the second-shield member in the open state; each of the sensor areas is formed with a height shorter than that of the reaction chamber; and each of the sensor areas is disposed with at least one position sensor for respectively detecting the first-shield member and the second-shield member within the sensing spaces of the sensor areas.

5. The thin-film-deposition equipment according to claim 1, further comprising at least one position sensor that is disposed on the reaction chamber, for detecting locations of the first-shield member and the second-shield member.

6. The thin-film-deposition equipment according to claim 1, wherein the first-shield member is formed with an area size larger than that of the second-shield member.

7. The thin-film-deposition equipment according to claim 1, wherein the shielding device further comprises a first-guard plate disposed on the first-shield member; and a second-guard plate disposed on the second-shield member; and when the first-shield member and the second-shield member approach each other into the shielding state, the first-guard plate and the second-guard plate approach each other, for guarding the first-shield member and the second-shield member.

8. The thin-film-deposition equipment according to claim 7, wherein in the shielding state, the first-shield member and the second-shield member have a first gap space therebetween, the first-guard plate and the second-guard plate have a second gap space therebetween; and the first gap space and the second gap space do not spatially overlap.

9. The thin-film-deposition equipment according to claim 8, wherein in the shielding state, the first-guard plate and the second-guard plate form the second gap space in an inclined manner relative to the first gap space.

10. The thin-film-deposition equipment according to claim 1, wherein the driver comprises a shaft seal, a first motor and a second motor; the shaft seal comprises an outer tube and a main shaft; the first motor is connected to the first-shield member via the outer tube of the shaft seal; and the second motor is connected to the second-shield member via the main shaft of the shaft seal.

11. The thin-film-deposition equipment according to claim 1, wherein the driver comprises two shaft seals and two motors; and the two motors are connected to the first-shield member and the second-shield member via the two shaft seals respectively.

12. A shielding device adapted to a thin-film-deposition equipment, comprising:
   a first-shield member that has a first-inner-edge surface disposed with at least one protrusion;
   a second-shield member that has a second-inner-edge surface disposed with at least one cavity corresponding to the at least one protrusion of the first-shield member; and
   a driver that interconnects and drives the first-shield member and the second-shield member to respectively sway in opposite directions between an open state and a shielding state, wherein in the shielding state, the first-shield member and the second-shield member are adjacent to each other with the at least one protrusion of the first-shield member entering the at least one cavity of the second-shield member.

13. The shielding device according to claim 12, wherein the driver comprises a shaft seal and at least one motor, and the at least one motor is connected to the first-shield member and the second-shield member via the shaft seal.

14. The shielding device according to claim 13, wherein the shaft seal comprises an outer tube and a main shaft; the outer tube has an inner space for containing the main shaft; the at least one motor is connected to the first-shield member via the outer tube, and connected the second-shield member via the main shaft, such that to synchronously drive the outer tube and the main shaft to rotate in the opposite directions respectively.

15. The shielding device according to claim 12, wherein the first-shield member is formed with an area size larger than that of the second-shield member.

16. The shielding device according to claim 12, further comprises a first-guard plate that is disposed on the first-shield member, and a second-guard plate that is disposed on the second-shield member, wherein when the first-shield member and the second-shield member approach each other into the shielding state, the first-guard plate and the second-guard plate approach each other, for guarding the first-shield member and the second-shield member.

17. The shielding device according to claim 16, wherein in the shielding state, the first-shield member and the second-shield member have a first gap space therebetween, the first-guard plate and the second-guard plate have a second gap space therebetween; and the first gap space and the second gap space do not spatially overlap.

18. The shielding device according to claim 17, wherein in the shielding state, the first-guard plate and the second-guard plate form the second gap space in an inclined manner relative to the first gap space.

19. The shielding device according to claim 12, wherein the driver comprises a shaft seal, a first motor and a second motor; the shaft seal comprises an outer tube and a main shaft; the first motor is connected to the first-shield member via the outer tube of the shaft seal; and the second motor is connected to the second-shield member via the main shaft of the shaft seal.

20. The shielding device according to claim 12, wherein the driver comprises two shaft seals and two motors; and the two motors are connected to the first-shield member and the second-shield member via the two shaft seals respectively.

* * * * *